United States Patent [19]
Gordon

[11] 4,125,028
[45] Nov. 14, 1978

[54] ROTATABLE LINK COUPLING MECHANISM FOR RADIO TUNING SHAFTS

[75] Inventor: Frank J. Gordon, Chicago, Ill.

[73] Assignee: Motorola, Inc., Schaumburg, Ill.

[21] Appl. No.: 822,975

[22] Filed: Aug. 8, 1977

[51] Int. Cl.² .............................. H03J 1/06; F16D 3/04
[52] U.S. Cl. .................................... 74/10 R; 64/12; 64/31; 74/10.27; 74/10.8
[58] Field of Search .............. 64/12, 31; 74/10 R, 74/10.8, 10.9, 10.27, 10.33, 68, 245 LP

[56] References Cited

U.S. PATENT DOCUMENTS

| | | | |
|---|---|---|---|
| 268,807 | 12/1882 | Landis | 64/31 X |
| 2,026,454 | 12/1935 | Benzing | 85/51 X |
| 2,343,244 | 3/1944 | Rose | 64/31 |
| 2,953,927 | 9/1960 | Race | 74/10.27 |
| 3,238,796 | 3/1966 | Goffstein | 74/10.27 |
| 3,258,988 | 7/1966 | Schmidt | 64/31 X |
| 3,664,153 | 5/1972 | Sugahara | 64/31 |
| 3,763,711 | 10/1973 | Yotsutani | 74/10.27 |
| 3,832,907 | 9/1974 | Yasuda | 74/10.33 |
| 4,060,006 | 11/1977 | Abel et al. | 74/245 LP |

*Primary Examiner*—Allan D. Herrmann
*Attorney, Agent, or Firm*—Melvin A. Klein; James W. Gillman

[57] ABSTRACT

A rotatable link coupling mechanism with a first disc attached to one end of a radio tuner shaft, a second intermediate disc, and a third disc attached to the end of a moveably positioned drive shaft. The first and second discs and the second and third discs are linked together respectively by a series of elongated coupling links which provide rotational coupling between the drive shaft and the radio tuner shaft.

3 Claims, 3 Drawing Figures

ROTATABLE LINK COUPLING MECHANISM FOR RADIO TUNING SHAFTS

BACKGROUND OF THE INVENTION

1. Field of the Invention

This invention relates to control apparatus, and more particularly to radio tuning control apparatus, said apparatus being adapted to be mounted in a variety of different support structures, each having different locations for control shafts.

2. Description of the Prior Art

Automotive entertainment radios are usually positioned behind the dashboard of an automobile and have a pair of shafts extending through apertures formed in the dashboard, providing manual volume control and manual tuning control. A tuning dial portion of the radio also extends through an aperture in the dashboard. Many radios also have push buttons for automatically selecting one of a predetermined set of operating frequencies. The dial display, the tuner mechanism, and the push-button keys, if used, generally are part of a tuner module affixed to a front plate. The front plate forms a part of the support housing for the radio receiver apparatus and also provides for mounting the radio apparatus to the dashboard. The control shafts for the radio receiver are also mounted to the front panel. The openings in the dashboard of an automobile for the dial display, the key buttons, and the control shafts have predetermined fixed locations for each of the many automobile models available. The relative position of the openings in the dashboard vary somewhat between the different models. Manufacturers and aftermarket suppliers of automotive radios, therefore, must make provisions to supply appropriately configured radio receivers to fit the various dashboard opening configurations.

It has long been recognized that a universally mountable radio would be very desirable. A manufacturer or supplier of such a radio would then be able to supply one basic radio receiver which would be accommodated by all dashboard opening configurations. With such a universally mountable radio, for example, the tuner mechanism shaft which drives the radio receiver tuning element and which is located usually at a distance from the front panel of the radio would be controlled by a variably positioned driving shaft. The shaft would be located on the front panel in a position depending upon the location of the dashboard opening.

One solution to this problem has been to provide a distinct configuration of driving shaft and associated support structure for each dashboard configuration. In many cases, this approach also requires that the tuner shaft length, as well as the support structure for both the driving shaft and the tuning shaft, be changed for each configuration.

Other somewhat more flexible approaches to solving the problem have been taken. One of these approaches involves using a series of discs and pinch washers, a disc being pinched between peripheral portions of a pinch washer. The disc and pinch washer approach performs the same functions as a series of intermeshing gears would. The disc and pinch washer approach, in particular, suffers from slippage and because of the requisite pinching action requires high torque, both undesirable features in an entertainment automotive radio receiver. The locus of positions for both the disc and pinch washer and the gear coupling mechanisms both are limited requiring the control shafts to be positioned on very restricted arcs of circles and portions of straight lines.

As is evident, providing for an individually designed control apparatus for each dashboard configuration and providing control apparatus having limited range of positions necessarily adds to cost and prevents an automotive radio receiver from being universally mountable in all possible dashboard configurations.

A particular kind of link coupling apparatus is provided in the prior art for coupling the shafts of two pieces of heavy rotating machinery when the shafts thereof are parallel but not coaxial. The coupler provided in the prior art has coupling bars which are rotatable about pins fixed to disc members, the rotation of the links being required to be confined to a plane perpendicular to the axes of the shafts. Pivotal movement of the links about the pins, that is, movement in planes other than perpendicular to the axes of the shaft is not provided by these prior art couplers so that the shafts may not be moved out of parallel alignment.

SUMMARY OF THE INVENTION

Accordingly, it is an object of this invention to provide control apparatus for a universally mountable radio receiver which provides for location of control shafts anywhere within a predetermined area of a radio receiver front panel.

It is another object of this invention to provide a universally mountable radio receiver suitable for use in a large number of different dashboard opening configurations.

It is another object of the invention to provide a universally mountable radio receiver having one tuner shaft and driving shaft support structure suitable for use with all dashboard configurations.

Briefly, the invention comprises an improved coupling apparatus for coupling a first to a second shaft. The second shaft is adjustably positioned with respect to the first shaft and both shafts each have a member affixed respectively to one end of each. A first and a second plurality of elongated link members are provided respectively for coupling between the first member and an intermediate member and between the intermediate member and the second member. The elongated link members are coupled to the various members at the ends thereof and at predetermined locations on the various members. The elongated link members are pivotally coupled to the various members to thereby provide rotational coupling between the first shaft and the second adjustably located shaft. According to one aspect of the invention the links are pivotally coupled to the first, second and intermediate members respectively at equally spaced positions on a circle inscribed about the axes of rotation of the respective member. According to another aspect of the invention, the link members have end portions which snap-fit pivotally engage grooves in pins attached to the various members. According to another aspect of the invention, a tuner shaft positioning mechanism is provided which includes a driving control shaft adjustably mounted on the front panel of a radio receiver. Attached to the driving shaft and to the tuning shaft of the radio are discs which are each respectively coupled to an intermediate disc by a first and a second plurality of elongated link members. The link members pivotally engage pivot pins mounted to one side of the first disc, both sides of the intermediate disc, and to one side of the second disc. This structure thereby provides rotational coupling between the driving shaft and the tuning shaft, the driving shaft being adjustably mounted on the front panel of the radio.

BRIEF DESCRIPTION OF THE DRAWING

For a more complete understanding of the invention, reference is made to the drawing in which.

DESCRIPTION OF THE PREFERRED EMBODIMENT

Figure 1:
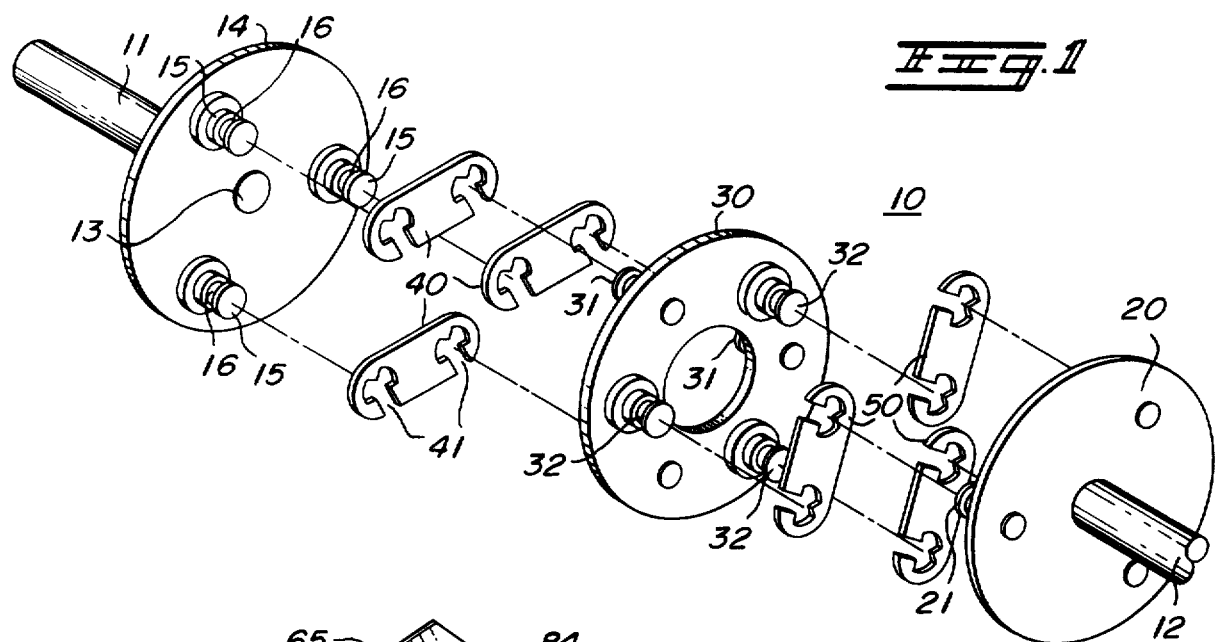
FIG. 1 is an exploded, perspective view of a rotatable link coupling mechanism according to the invention.

Referring to FIG. 1 of the drawings, a coupling apparatus 10 is shown for providing drive power from a first shaft 11 to a second shaft 12. The axes of the first shaft 11 and the second shaft 12 are shown as being parallel; but, as will be described hereinbelow, the shafts are not required to have parallel axes. Fixed to an end 13 of the first shaft is a first disc 14, which rotates about the axis of the first shaft 11. Located on one side of the first disc 14 on a circle centered about the axis of rotation of the first shaft 11 are three pivot pins 15 perpendicularly affixed to the first disc 14, for example, by being press-fit into holes in the first disc 14. On the outer surfaces of each of the pivot pins 15 are contained circumferential grooves 16, the function of which will be explained hereinbelow. The second shaft 12 also has affixed to it a second disc 20, which is similar to the first disc 14. Three pivot pins 21 (not all shown) are perpendicularly affixed to one side of the disc. The pins are also located equally spaced apart on a circle centered on the axis of rotation of the second shaft 12.

An intermediate disc 30 is also provided between the first and second disc and has two sets each of three pivot pins 31, 32. The first set 31 of pivot pins is located on the side of the intermediate disc 30 facing the first disc 14. The second set 32 of pivot pins is located on the side of the intermediate disc 30 facing the second disc 20. Each of these sets of pins also has the pins equally spaced and located on a circle having its center at the axis of rotation of the intermediate disc 30.

A first set of elongated links 40 includes three links. At each end of each link is formed a central aperture 41 (typically shown). The ends of the elongated links 40 thereby have C-shaped portions for snap-fit pivotal engagement with the circumferential groove 16 of the pivot pins 15 on the first disc 14 and the pivot pins 31 of the intermediate disc 30. Similarly, a second set of elongated links 50 is provided for coupling between the pivot pins 32 on the intermediate disc 30 and the pins 21 on the second disc 20. The apertures 41 on each end of each link are configured so that the end portion of each link fits within the grooves 16 on each of the pivot pins. The links are rotatable in a plane perpendicular to the axis of each pin fixed to the discs. Additionally, the links pivot to some degree within the grooves 16 on each pin. The pivotal movement of the links include not only movement of the links in a plane perpendicular to the axis of the pivot pins but also in planes which are not perpendicular to the axis of the pin. When assembled, the coupling apparatus as described above, therefore, because of the pivotal engagement of the links with the pins on the discs, allows the first shaft 11 and the second shaft 12 axes to be moved so as to be non-parallel. The apparatus as described also allows for a certain amount of axial displacement of the first shaft 11 and the second shaft 12.

In operation, for example, shaft 11 may be a driving shaft and shaft 12 may be the driven shaft. The links 40 will transmit the rotary motion of the disc 14 to the intermediate disc 30 which rotates about an axis different than the axis of shaft 11. The links 50 coupled to the intermediate disc 30 couple the intermediate disc 30 to the second disc 20, which is caused to rotate about the axis of the second shaft 12. The link members being rigid are alternatively in tension or compression as the apparatus is operated. The shaft 12 may be positioned with respect to shaft 11 in a wide variety of locations. The axis of the intermediate disc 30 assumes a position depending on the relative position of shaft 11 with respect to shaft 12. When the axis of the first shaft 11 and the axis of the second shaft 12 are closer than a certain distance, the intermediate disc 30 axis moves in a circular locus and in an eccentric locus with respect to each of the shafts.

Figure 2:
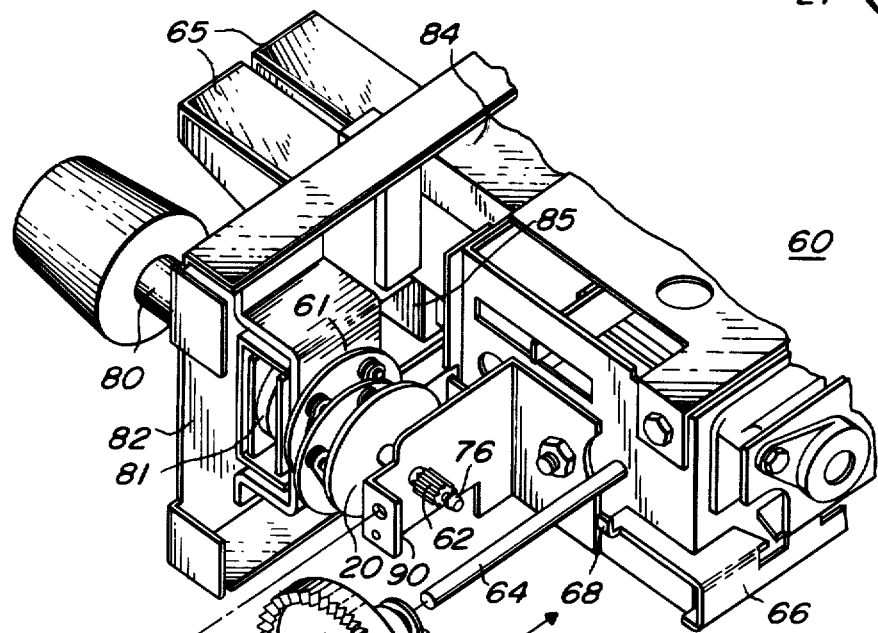
FIG. 2 is a partially cut-away perspective view, partially exploded of a radio tuner, front panel, tuner drive arrangement, and coupler according to the invention.

Referring now to FIG. 2, a cut-away portion of a typical automotive radio receiver 60 is shown, including a tuner control coupling apparatus 61 which is similar to the coupling apparatus 10 shown in FIG. 1 and wherein like numerals are used for like parts. Corresponding to the second shaft 12 of FIG. 1 is a pinion gear 62. The pinion gear drives a crown gear 63 which rotates about a tuner shaft 64 and also slides along the axis of the tuner shaft 64. When a pushbutton 65 is depressed, an actuator 66 is caused to move in the direction of arrow 67. The actuator 66 has a tab 68 which engages a groove 70 at the base portion of the crown gear 63 causing the crown gear to move in the direction of the arrow 67. Note that the crown gear 63 is not fixed to the tuner shaft 64 and does not rotate therewith. The crown gear 63 force is, however, applied to the tuner shaft 64 through a clutch arrangement including a clutch backplate 71 which is affixed to the end of the tuner shaft 64 by a set screw 72. Affixed to the interior surface of the clutch backplate 71 is a clutch disc 73. The clutch backplate 71 and the clutch disc 73 both rotate with the tuner shaft 64. A clutch plate 74 is rigidly affixed to the crown gear base 63a. The actuator 66 is normally positioned so that the tab 68 thereof forces the clutch plate 74 against the clutch disc 73. Motion of the crown gear 63 is then transmitted through the engaged clutch to the tuner shaft 64. The clutch plate 74 is moved in the direction of arrow 67 when a pushbutton 65 is depressed and then the crown gear 63 is disengaged from the tuner shaft 64.

A resilient disc 75 is also attached to the base 63a of the crown gear 63 and is assembled so as to apply force against the tip 76 of the pinion gear 62, keeping the pinion gear 62 and the crown gear 63 teeth engaged.

The pinion gear 62 is affixed to the disc 20 which is part of the coupling apparatus assembly 61. A tuning control shaft 80 is mounted by means of a bushing assembly 81 to the front panel 82 of the auto radio in an aperture (not shown) therein. The relationship of the aperture for the tuning control shaft and the apertures 84, 85 for the pushbuttons 65 and the dial display of the radio are determined by the particular configuration of the dashboard holes into which the radio mounts. This requires that the location of the tuning control aperture be variable. The variation in position of the tuning control can be accommodated by the coupling mechanism of the invention. A wide variety of positions can be assumed by the bushing assembly 81 on the front panel 82.

Figure 3:
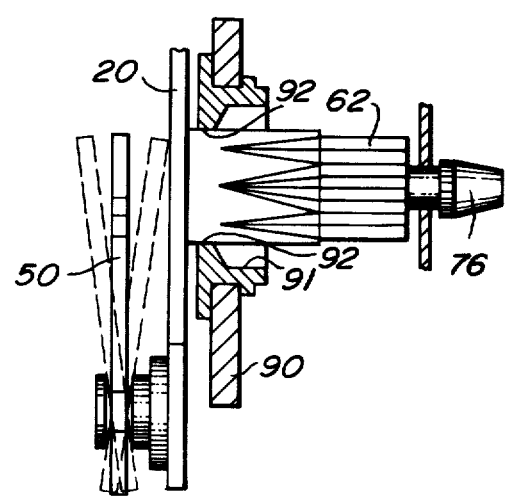
FIG. 3 is a plan view, partially cut away, of a portion of the apparatus as shown in FIG. 2 showing a pinion gear and a coupler according to the invention.

Referring to FIG. 3 of the drawings, a detail drawing of the mounting of the coupling apparatus and the pinion gear support bracket 90 shows a pinion gear bearing 91 which has a relatively narrow bearing surface 92. When the clutch is disengaged by the actuator 66, the resilient disc 75 bears against the tip 76 of the pinion gear 62 causing the pinion gear 62 to not be aligned squarely with respect to the bearing 91. Therefore, the bearing surface 92 must be relatively narrow to allow the pinion gear to be pivoted within the bearing. Since the pinion gear 62 is rigidly fixed to the disc 20, the disc 20 pivots to a plane which is not perpendicular to its axis of rotation. To some extent, the pivoting motion of the disc 20 is coupled through the set of elongated links 50 to the intermediate disc 30, which also pivots slightly about its axis of rotation. It is therefore, nececessary that the links coupling the dics have a connection which is flexible as well as allowing rotation of the links around the pin mounted on each of the discs. This flexible connection of the links to the pins is shown by the dotted outlines of link 50 shown in FIG. 3. The flexible connection allows the pinion gear to be non-parallel with the control shaft extending through the bushing assembly 81.

While a particular embodiment of the present invention has been shown and described, it should be understood that the invention is not limited thereto since many modifications may be made. It is therefore contemplated to cover by the present application any and all such modifications that fall within the true spirit and scope of the basic underlying principles disclosed and claimed herein.

I claim:

1. An improved coupling apparatus for coupling rotatable shaft members comprising
   first and second shaft members supported for rotation on axes,
   first and second resilient disc members affixed to said first and second shaft members, respectively,
   a third resilient disc member positioned intermediate said first and second disc members,
   said disc members each having a plurality of pin members extending axially therefrom and each of said pin members being formed with a circumferential groove therein,
   link members pivotally coupling said disc members together by engaging said pin members in the grooves thereof whereby upon positioning said shaft members on non-parallel axes, flexing can occur between said disc members, link members, and shaft members,
   wherein said link members are formed with resilient opened portions on the ends thereof.

2. Apparatus according to claim 1 wherein said end portions are C-shaped with a central aperture for snap-fit engagement with said pin members.

3. An improved tuning apparatus for a radio receiver comprising
   a frame,
   first shaft means mounted on said frame for driving a tuner mechanism,
   second shaft means mounted on said frame and engageable with said first shaft means for manually tuning said radio receiver,
   first and second resilient disc members affixed to said first and second shaft means, respectively,
   a third resilient disc member positioned intermediate said first and second disc members,
   said disc members each having a plurality of pin members extending axially therefrom and each of said pin members being formed with a circumferential groove therein,
   link members pivotally coupling said disc members together by engaging said pin members in the grooves thereof whereby upon disengaging manual tuning mechanism and causing said first and second shaft means to be positioned on non-parallel axes, flexing can occur between said disc members, link members, and shaft means.

* * * * *